(12) United States Patent
Wang

(10) Patent No.: US 7,238,556 B2
(45) Date of Patent: Jul. 3, 2007

(54) THIN FILM TRANSISTOR STRUCTURE AND METHOD OF MANUFACTURING THE SAME

(75) Inventor: Cheng-Chi Wang, Tainan (TW)

(73) Assignee: Chi Mei Optoelectronics Corp., Tainan (TW)

( * ) Notice: Subject to any disclaimer, the term of this patent is extended or adjusted under 35 U.S.C. 154(b) by 302 days.

(21) Appl. No.: 10/980,954

(22) Filed: Nov. 4, 2004

(65) Prior Publication Data

US 2005/0101071 A1   May 12, 2005

(51) Int. Cl.
*H01L 21/84* (2006.01)
(52) U.S. Cl. ............... 438/160; 438/164; 257/E21.414
(58) Field of Classification Search ............... 438/159, 438/160, 164; 257/E21.414
See application file for complete search history.

(56) References Cited

U.S. PATENT DOCUMENTS 5,485,038 A * 1/1996 Licari et al. ............... 257/78
5,917,199 A * 6/1999 Byun et al. ................ 438/159
6,274,400 B1 * 8/2001 Jen ............................ 438/160

FOREIGN PATENT DOCUMENTS

JP        06/084946     * 3/1994

* cited by examiner

*Primary Examiner*—Chandra Chaudhari
(74) *Attorney, Agent, or Firm*—Thomas, Kayden, Horstemeyer & Risley

(57) ABSTRACT

The present invention improves the quality of the TFT structure by avoiding photo-induced current, and lowers manufacturing costs by decreasing the number of masks required in the process, wherein the former is achieved by the stacked structure including a gate layer, an insulation layer, an amorphous silicon layer and an ohmic contact layer, and the latter is achieved by using the stacked structure as a mask and by exposing the substrate from the back surface.

8 Claims, 8 Drawing Sheets

THIN FILM TRANSISTOR STRUCTURE AND METHOD OF MANUFACTURING THE SAME

This application claims the benefit of Taiwan application Serial No. 091121395, filed Sep. 18, 2002.

BACKGROUND OF THE INVENTION

1. Field of the Invention

The invention relates in general to a thin film transistor (TFT) structure and the method of manufacturing the same, and more particularly to a TFT structure with higher quality and a manufacturing method thereof with less photolithographic steps.

2. Description of the Related Art

The thin film transistor (TFT) has been widely used in liquid crystal displays (LCD), wherein a conventional manufacturing method thereof is shown in FIGS. 1 to 5.

FIG. 1 illustrates the formation of a gate on a substrate. First, a substrate 100 is provided, and a metal layer is deposited on the substrate 100. Then, a gate electrode 110 is formed by photolithography and etching the metal layer.

FIG. 2 illustrates the formation of a gate insulation layer, an amorphous silicon layer, and an ohmic contact layer. A gate insulation layer 120 is deposited on the substrate 100, covering the gate electrode 110. Then, an amorphous silicon layer and an ohmic contact layer are formed sequentially on the gate insulation layer 120, and are etched using a patterned photoresist (not shown) as a mask. The patterned photoresist is then removed and therefore a patterned amorphous silicon layer 130 and an ohmic contact layer 140 are formed as shown in FIG. 2.

FIG. 3 illustrates the formation of a source electrode and a drain electrode. A metal layer is formed on the substrate 100 and is patterned by a lithography and etching step. An opening 162 is formed in the metal layer, to open through the patterned ohmic contact layer 140 and to expose portion of the amorphous silicon layer 130. A source electrode 165 and a drain electrode 160 are consequently formed while forming the opening 162.

FIG. 4 illustrates the formation of a passivation layer on the substrate 100. A passivation layer 170 is deposited on the substrate 100. Then, an opening 172 is formed by a photolithography and etching process to expose the drain electrode 160.

FIG. 5 illustrates the formation of a transparent electrode. A transparent conductive layer is deposited on the passivation layer 170 and fills the opening 172 of the passivation layer 170. The transparent conductive layer is patterned by lithography and etching methods; a transparent electrode 180 is formed, consequently. Five masks are required in the TFT manufacturing processes described above, which are respectively shown in FIGS. 1 to 5.

A manufacturing method using four masks to fabricate a thin film transistor has been developed by combining the steps of FIG. 2 and FIG. 3. However, the light incident from the rear side of the substrate directly illuminates the amorphous silicon layer, and a photo-induced current is undesirably produced. Therefore, the OFF characteristic of the TFT becomes worsen, and result in deterioration of the quality of the TFT is deteriorated.

SUMMARY OF THE INVENTION

It is therefore an object of the invention to provide a TFT structure with lower photo-induced current and a method of manufacturing thereof at a lower cost.

In an aspect of the present invention a thin film transistor (TFT) structure is provided. A plurality of stacked layers is formed on a substrate, comprising a first conducting layer, an insulation layer, an amorphous silicon layer and an ohmic contact layer. Then, a patterned photo-imagable layer is formed between the stacked layers, for the purpose of exposing the ohmic contact layer. Next, a second conducting layer is formed on the patterned photo-imagable layer and the ohmic contact layer. The second conducting layer and the ohmic contact layer are then patterned to expose portion of the amorphous silicon layer, thereby forming a source electrode and a drain electrode simultaneously. Afterwards, a passivation layer is formed on the amorphous silicon layer and part of the second conducting layer. Finally, a transparent electrode is formed on the second conducting layer and covers the passivation layer, wherein the transparent electrode electrically connects to the second conducting layer.

In another aspect of the invention, a thin film transistor (TFT) structure is provided. Said TFT substrate comprising a plurality of first stacked structures and a plurality of second stacked structures on a substrate, wherein said plurality of first stacked structures include a first conducting layer, an insulation layer, an amorphous silicon layer, and an ohmic contact layer, and said plurality of second stacked structures at least includes said first conducting layer; a photo-imagable layer between said plurality of first stack structures and said plurality of said second stacked structures; a source electrode and a drain electrode on said photo-imagable layer and said plurality of first stacked structures; a passivation layer on said photo-imagable layer and said source electrode and said drain electrode; and a transparent electrode on said passivation layer wherein a first portion of said transparent electrode electrically connects to one of said source electrode, and drain electrode and a second portion of said transparent electrode electrically connects said second conducting layer of said plurality of first stacked structure and said first conducting layer of said plurality of second stacked structure.

According to another aspect of this invention, a method of forming a thin film transistor (TFT) structure is provided. This method comprises the steps of providing a substrate having a first surface and a second surface; forming a plurality of first pre-stacked structures and a plurality of second pre-stacked structures on said first surface of said substrate, said plurality of first pre-stackerd structures includes a first conducting layer, an insulation layer, an amorphous silicon layer, an ohmic contact layer, and a photoresist layer having a first thickness, said plurality of second pre-stack structures includes said first conducting layer, said insulation layer, said amorphous silicon layer, an ohmic contact layer, and a photoresist layer having a second thickness, wherein said second thickness is less than said first thickness; removing said photoresist layer having said second thickness to expose said plurality of second pre-stack structures; removing said ohmic contact layer and said amorphous silicon layer of said plurality of second pre-stacked structures to form a plurality of first stacked structures and a plurality of second stacked structures, wherein said plurality of first stack structures includes said first conducting layer, said insulation layer, said amorphous silicon layer, and said ohmic contact layer, and said plurality of second stacked structures at least includes said first conducting layer; forming a patterned photo-imagable layer between said plurality of first stacked structures and said plurality of said second stacked structures, wherein said substrate is exposed from said second surface by using said plurality of first stacked structures and said plurality of said second stacked structures as the masks; forming a second conducting layer on said patterned photo-imagable layer, said plurality of first stacked structures, and said plurality of said second stacked structures; patterning said second conducting layer to expose a part of said amorphous silicon layer of said plurality of first stacked structures; and forming a passivation layer on said amorphous silicon layer of said plurality of first stacked structure, said first conducting layer of said plurality of second stacked structure, and said second conducting layer of said plurality of first stacked structure; and forming a transparent electrode on said passivation layer of said plurality of first stacked structure and said plurality of second stacked structure, wherein a first portion of said transparent electrode electrically connects to one of said source electrode and drain electrode and a second portion of said transparent electrode electrically connects said second conducting layer of said plurality of first stacked structure and said first conducting layer of said plurality of second stack structure.

Other objects, features, and advantages of the invention will become apparent from the following detailed description of the preferred but non-limiting embodiments. The following description is made with reference to the accompanying drawings.

DETAILED DESCRIPTION OF THE INVENTION

The present invention provides a thin film transistor (TFT) free from photo-induced current and a fabrication thereof using a four-mask manufacturing process. The TFT has a photo-imagable layer and a stacked structure having a gate electrode, an insulating layer, an amorphous layer, and an ohmic contact layer. The first embodiment of the present invention is illustrated in FIG. 6 to FIG. 10, and the second embodiment of the present invention is illustrated in FIG. 11 to FIG. 18B

FIRST EMBODIMENT

Figure 1:
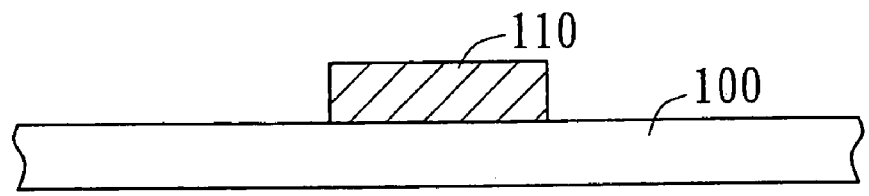
FIG. 1 to FIG. 5 illustrate a conventional manufacturing method of a thin film transistor (TFT) structure.
Figure 2:
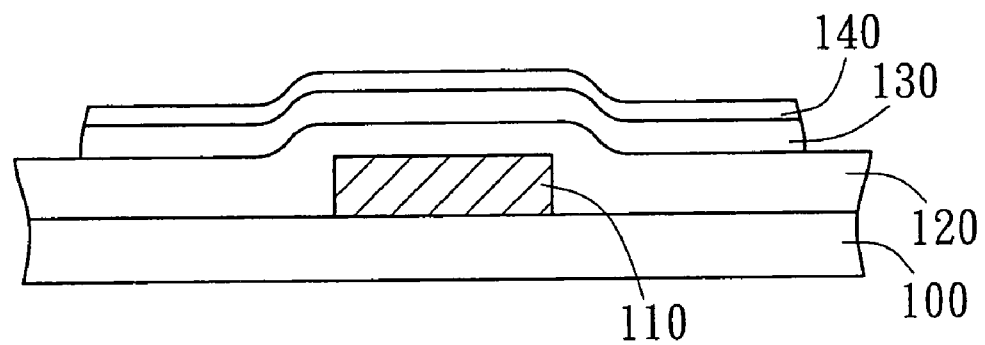
Figure 3:
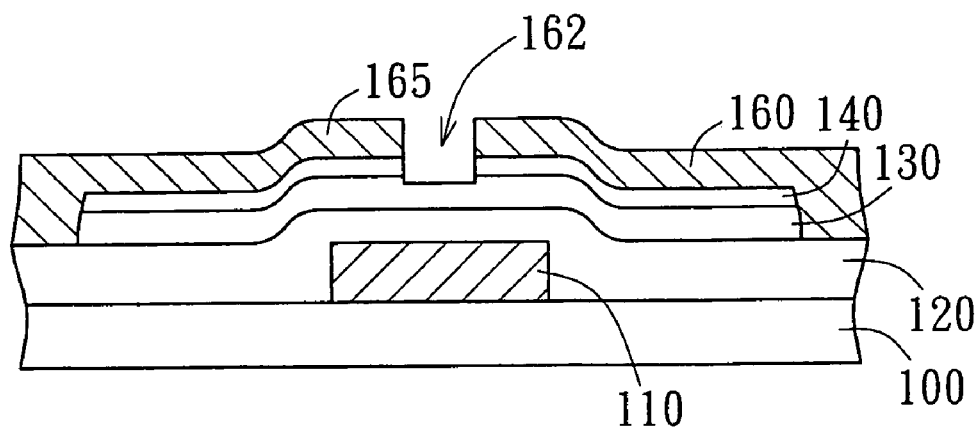
Figure 4:
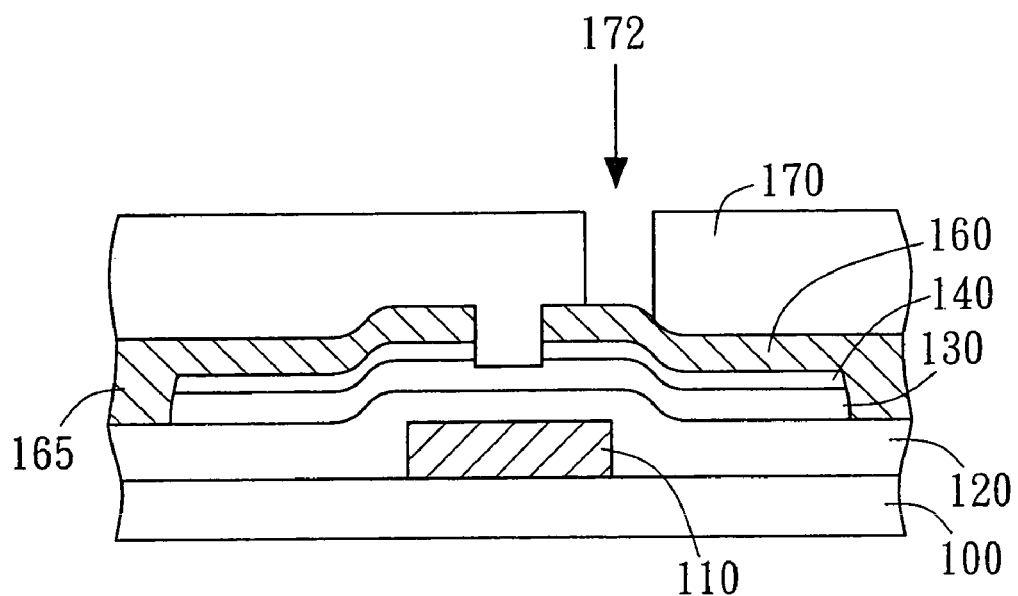
Figure 5:
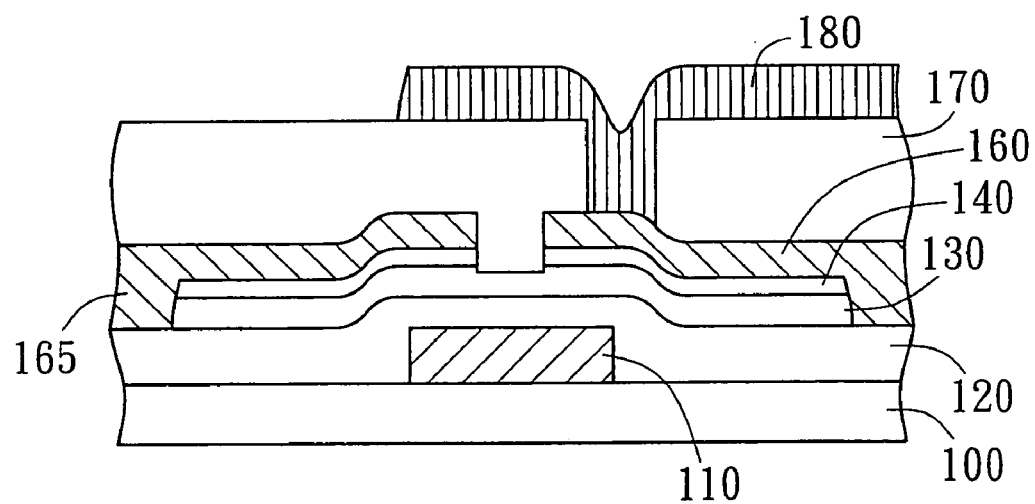
Figure 6:
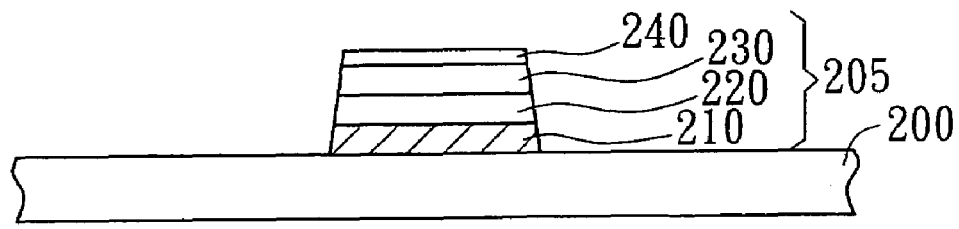
FIG. 6 to FIG. 10 illustrate a manufacturing method of a TFT structure according to a first embodiment of the present invention.

FIG. 6 illustrates the formation of a stacked structure 205. First, a substrate 200 is provided. Then, a metal layer, an insulating layer, an amorphous silicon layer, an ohmic contact layer and a photo-resist layer (not shown in FIG. 6) are sequentially deposited on the substrates 200. Next, the photo-resist layer is patterned by a photolithography method. Afterwards, the ohmic contact layer, the amorphous silicon layer, the insulating layer, and metal layer are etched using the patterned photo-resist layer as a mask. Finally, the stacked structure 205 having the gate electrode 210, insulating layer 220, amorphous silicon layer 230, and ohmic contact layer 240 is formed by removing the patterned photo-resistive layer. The gate electrode 210, insulating layer 220, and ohmic contact layer 240 can be respectively made of metal material, silicon nitride, and an amorphous silicon layer doped with phosphoric (P) ion.

Figure 7:
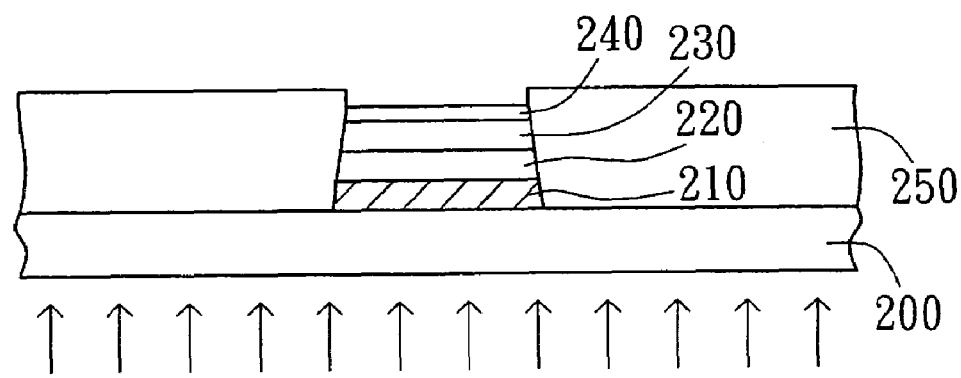

Referring to FIG. 7, a photo-imagable layer 250 is coated on the substrate 200 and covers the upper surface of the stacked structure 205. Then, the substrate 200 is exposed by light from the backside, and the photo-imagable layer 250 on the stacked structure 205 is removed by a developing method.

Figure 8:
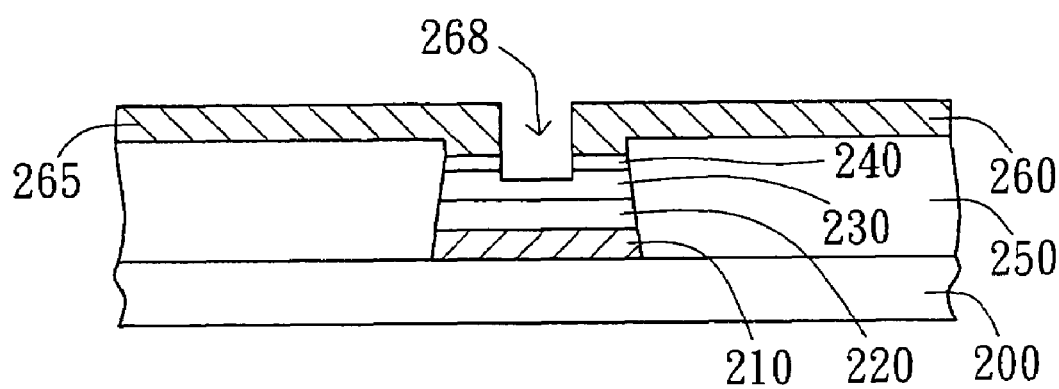

In FIG. 8, a conducting layer 260 is formed on the photo-imagable layer 250 and ohmic contact layer 240. The conducting layer 260 and the ohmic contact layer 240 are patterned to expose portion of the amorphous silicon layer 230 by a photolithography and etching method. As an opening 268 is created in the conducting layer 260, a source electrode 260 and a drain electrode 265 are formed as well. The conducting layer 260 can be any conductive metal, such as Cr, Mo, Al, Cu, Ti, or W.

Figure 9:
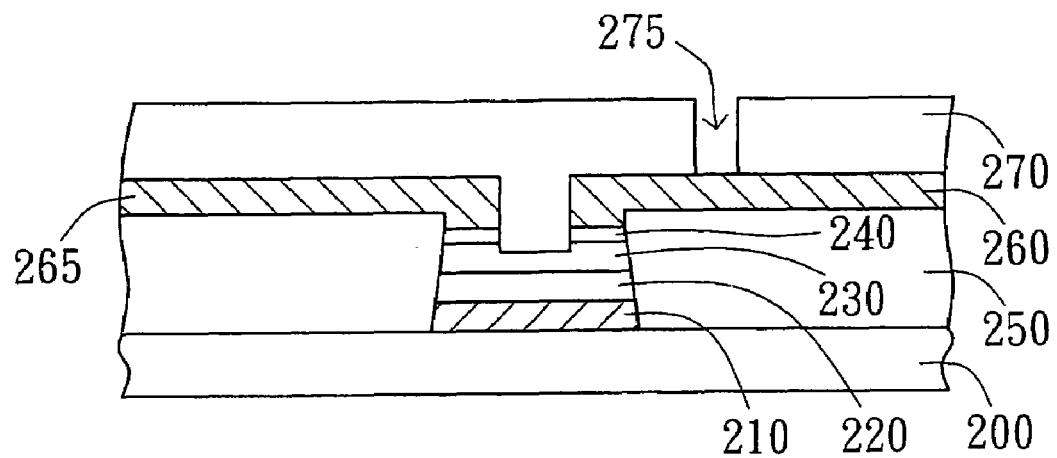

Referring to FIG. 9, a pssivation layer 270 is deposited on the conducting layer 260 and fills the opening 268, wherein the passivation layer 270 can be made of silicon oxide or silicon nitride. The passivation layer 270 is patterned by a photolithography and etching method, such that a contact hole 275 exposing the drain electrode 265 or the source electrode 260 is formed in the passivation layer 270.

Figure 10:
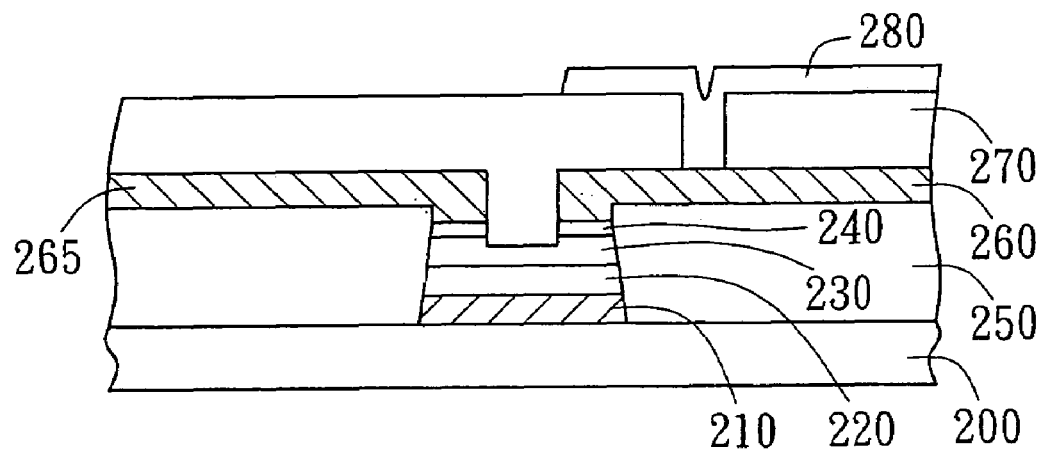

As shown in FIG. 10, a transparent electrode layer is deposited on the passivation layer 270 and fills the contact hole 275, wherein the transparent electrode layer can be indium-tin-oxide (ITO). Then, the transparent electrode layer is patterned by lithography and etching method to form the transparent electrode 280.

From the above description, the first embodiment of the present invention requires four masks to accomplish, wherein the stacked structure, instead of a single layer of patterned photo-resist, is utilized as a mask to perform an exposure process from the rear side of the substrate (as shown in FIG. 7). Moreover, the light from the rear side of the substrate 200 will not directly illuminate the amorphous silicon layer 230 because the gate electrode 210 shields the light irradiating to the amorphous silicon layer 230. Consequently, the TFT structure is free from photo-induced current and the quality thereof is improved.

SECOND EMBODIMENT

Figure 11:
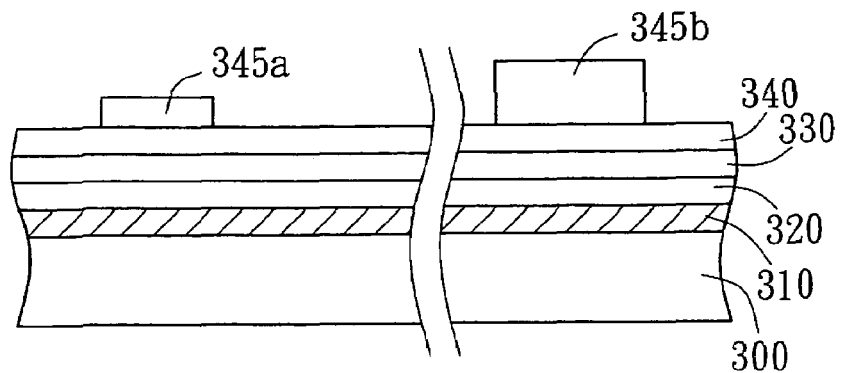
FIG. 11 to FIG. 18B illustrate a manufacturing method of a TFT structure according to a second embodiment of the present invention.

Referring to FIG. 11, a first conducting layer 310, an insulation layer 320, an amorphous silicon layer 330 and an ohmic contact layer 340 are sequentially formed on a substrate 300, wherein the first conducting layer 310 is used as a gate electrode. Then, a photo-resist layer having at least a first thickness and a second thickness (not shown in the figure) is formed on the ohmic contact layer 340. The patterned photo-resist layer 345a, 345b having at least a first thickness and a second thickness can be formed by using half tone mask, wherein the patterned photo-resist layer 345a is thinner than the patterned photo-resist layer 345b. Afterwards, the ohmic contact layer 340, the amorphous silicon layer 330, the insulation layer 320, and first conducting layer 310 are etched using the patterned photo-resist layers 345a and 345b as the etching masks; the resultant profile is shown in FIG. 12.

Figure 12:
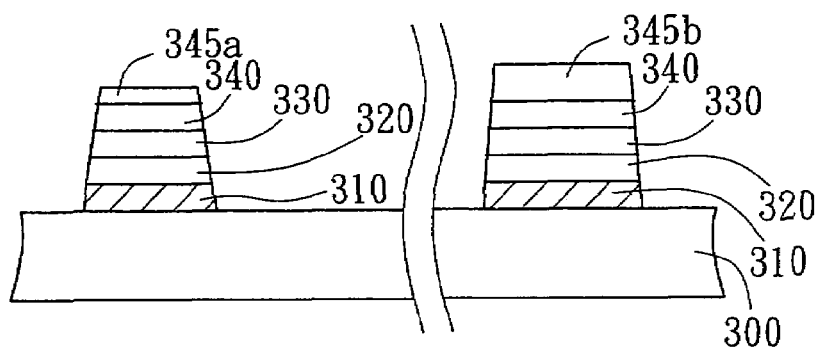
Figure 13:
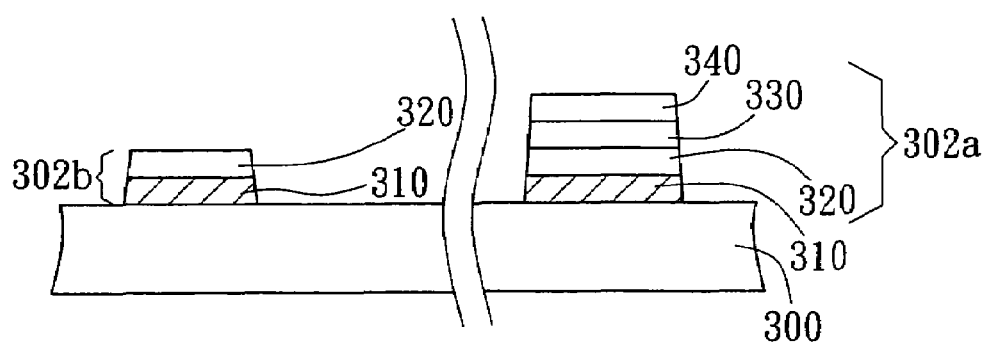

While the etching step of FIG. 12 continues to process, two stacked structures will be formed, as shown in FIG. 13. The first stacked structure 302a includes the first conducting layer 310, insulation layer 320, amorphous silicon layer 330, and ohmic contact layer 340. The second stacked structure 302b includes the first conducting layer 310 and the insulation layer 320. An ashing process is then preformed on the patterned photo-resist layer 345a/345b. Since the patterned photo-resist 345a is thinner than the patterned photo-resist 345b, the patterned photo-resist layer 345a is first removed during ashing, leading to exposure of the ohmic contact layer 340 under the patterned photo-resist layer 345a. This ashing step removes the photo-resist layer 345a, but only removes a part of the photo-resist layer 345b and a part of the photo-resist layer 345b is still left on the ohmic contact layer 340 thereunder. After the ashing process, the ohmic contact layer 340 and the amorphous silicon layer 330 under the patterned photo-resist layer 345a are removed by an etchant. Meanwhile, the ohmic contact layer 340 and the amorphous silicon layer 330 below the patterned photo-resist layer 345b will not be etched when removing the ohmic contact layer 340 and the amorphous silicon layer 330 under the patterned photo-resist layer 345a since they are protected by the remaining part of the photo-resist layer 345b. The remaining part of the photo-resist 345b on the ohmic contact layer 340 is then removed by ashing or stripping. The etching step described herein is optionally determined by practical requirements. For example, the insulation layer 320 under the patterned photo-resist layer 345a can also be removed.

Figure 14:
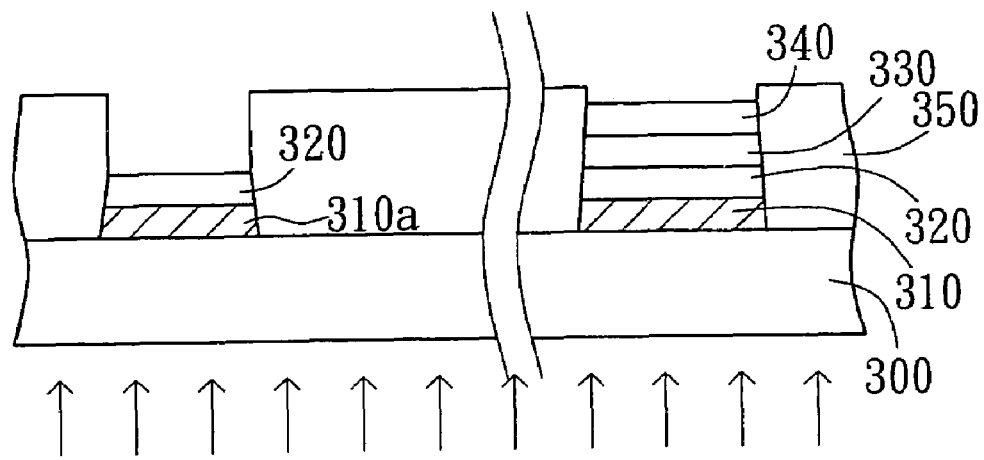

Referring to FIG. 14, a photo-imagable layer 350 is coated on the substrate 300 and covers the surfaces of the first stacked structure 302a and the second stacked structure 302b. Then, the substrate 300 is exposed from the backside, and the photo-imagable layer 350 on the first stacked structure 302a and second stacked structures 302b is removed by a developing method, wherein the arrows in FIG. 14 represent the exposing light.

Figure 15:
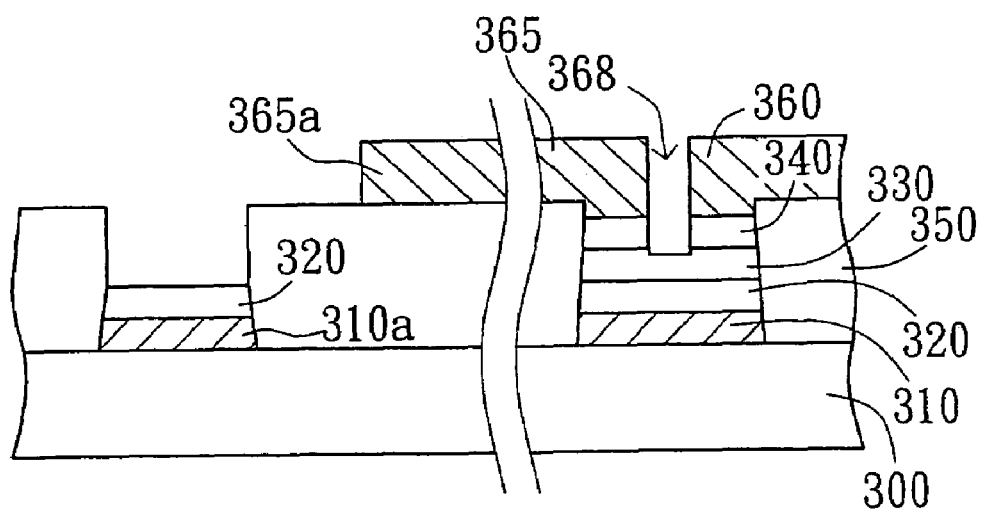

In FIG. 15, a conducting layer is formed on the photo-imagable layer 350, the insulation layer 320, and the ohmic contact layer 340. The conducting layer and the ohmic contact layer 340 are patterned to expose the amorphous silicon layer 330 and insulation layer 320 by a photolithography and etching method. As an opening 368 is formed in the conducting layer, a source electrode 360, a drain electrode 365 and a second conducting layer 365a are formed as well. The conducting layer can be any conductive metal such as Cr, Mo, Al, Cu, Ti, and W.

Figure 16:
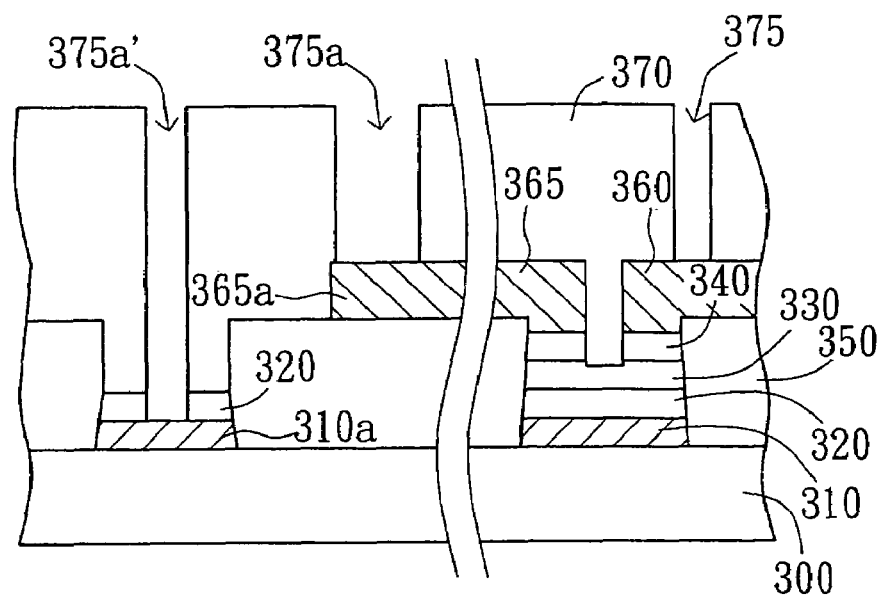

Referring to FIG. 16, a passivation layer 370 is deposited on the conducting layer and the photo-imagable layer 350, and fills the opening 368, wherein the passivation layer 370 can be made of silicon oxide or silicon nitride. The passivation layer 370 is patterned by a photolithography and etching method, such that openings 375, 375a, 375a' are formed in the passivation layer 370. The openings 375, 375a, and 375a', respectively, are formed for exposing the drain electrode 365 or source electrode 360, the second conducting layer 365a, and first conducting layer 310a.

Figure 17:
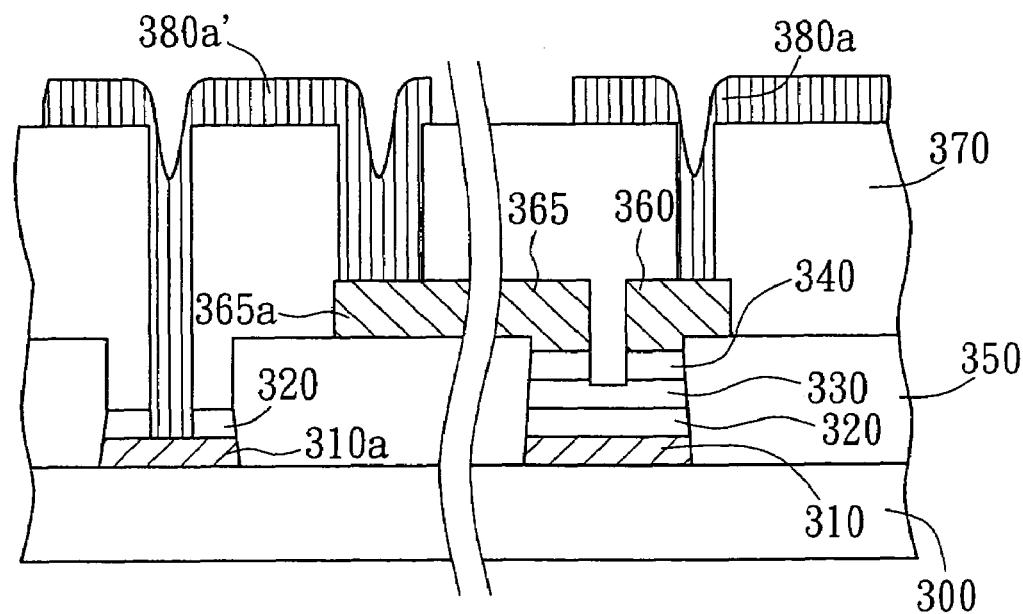

In FIG. 17, a transparent electrode layer is deposited on the passivation layer 370 and fills the openings 375, 375a, and 375a', wherein the transparent electrode layer can be indium-tin-oxide (ITO). Then, the transparent electrodes 380a, and 380a' are formed by a lithography and etching method, and the latter is used to connect the first conducting layer 310a and the second conducting layer 365a.

Figure 18A:
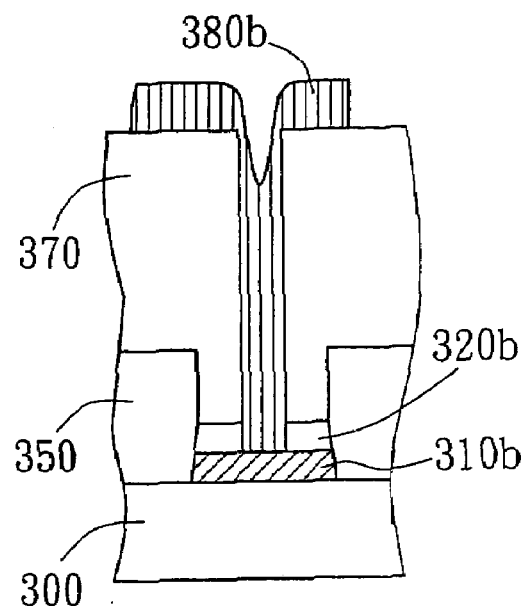
Figure 18B:
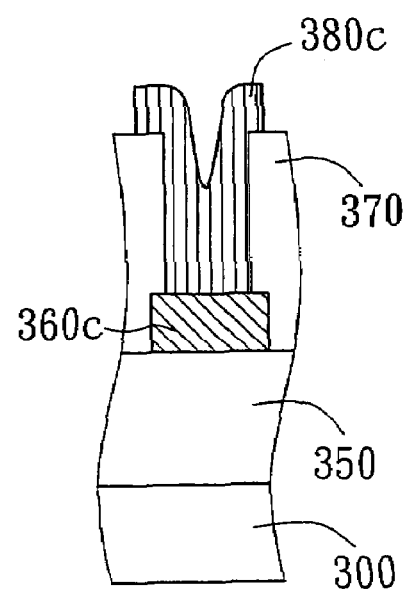

FIG. 18A and FIG. 18B respectively illustrate that the first conducting layer 310b and the second conducting layer 360c are connected to the external circuits through a transparent electrode 380b and a transparent electrode 380c, respectively. To accommodate the profiles as shown in FIG. 17, FIG. 18A and FIG. 18B, the passivation layer 370 is first patterned, and then the transparent electrodes 380b and 380c are defined simultaneously.

From the above description, there are five patterning processes shown in FIGS. 13 to 17, respectively. However, no mask is required in FIG. 14, and only four masks are utilized in the second embodiment. Thus, the manufacturing cost is reduced. Moreover, the light irradiated from the rear side of the substrate 300 will not directly illuminate the amorphous silicon layer 330, allowing the TFT structure to remain free from photo-induced current. Accordingly, the OFF characteristic and the TFT quality are enhanced. Therefore, by decreasing the number of masks and avoiding photo-induced current, the present invention has the advantages of lower cost and higher quality.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a thin film transistor (TFT) structure, said method comprising the steps of:
   providing a substrate having a first surface and a second surface;
   forming a plurality of stacked structures on said first surface of said substrate, each stacked structure including a first conducting layer, an insulation layer, an amorphous silicon layer, and an ohmic contact layer;
   forming a patterned photo-imagable layer between said plurality of stacked structures so as to be in contact with the first conducting layer, the insulation layer, the amorphous silicon layer and the ohmic contact layer;
   forming a second conducting layer on said patterned photo-imagable layer and said ohmic contact layer;
   patterning said second conducting layer and said ohmic contact layer to expose said amorphous silicon layer, wherein a source electrode and a drain electrode are formed on the photo-imagable layer;
   forming a passivation layer on said amorphous layer and said second conducting layer; and
   forming a transparent electrode on said passivation layer and electrically connecting to said second conducting layer.

2. The method according to claim 1, wherein said plurality of stacked structures are formed in one step of photolithography.

3. The method according to claim 1, wherein said substrate is exposed from said second surface by using said plurality of stacked structure as masks in said step of forming a patterned photo-imagable layer.

4. The method according to claim 1, wherein said first conducting layer is a gate electrode.

5. A method of forming a thin film transistor (TFT) structure, said method comprising the steps of:
   providing a substrate having a first surface and a second surface;
   forming a plurality of first pre-stacked structures and a plurality of second pre-stacked structures on said first surface of said substrate, each first pre-stacked structure including a first conducting layer, an insulation layer, an amorphous silicon layer, an ohmic contact layer, and a photoresist layer having a first thickness, each second pre-stacked structure including said first conducting layer, said insulation layer, said amorphous silicon layer, an ohmic contact layer, and a photoresist layer having a second thickness, wherein said second thickness is less than said first thickness;

removing said photoresist layer having said second thickness to expose said plurality of second pre-stacked structures;

removing said ohmic contact layer and said amorphous silicon layer of said plurality of second pre-stacked structures to form a plurality of first stacked structures and a plurality of second stacked structures, wherein said plurality of first stacked structures includes said first conducting layer, said insulation layer, said amorphous silicon layer and said ohmic contact layer, and said plurality of second stacked structures at least includes said first conducting layer;

forming a patterned photo-imagable layer between said plurality of first stacked structures and said plurality of said second stacked structures, wherein said substrate is exposed from said second surface by using said plurality of first stacked structures and said plurality of said second stacked structures as masks;

forming a second conducting layer on said patterned photo-imagable layer, said plurality of first stacked structures, and said plurality of said second stacked structures;

patterning said second conducting layer to expose a part of said amorphous silicon layer of said plurality of first stacked structures;

forming a passivation layer on said amorphous silicon layer of said plurality of first stacked structure, said first conducting layer of said plurality of second stacked structure, and said second conducting layer of said plurality of first stacked structure; and forming a transparent electrode on said passivation layer of said plurality of first stacked structure and said plurality of second stacked structure, wherein a first portion of said transparent electrode electrically connects to one of said source electrode and drain electrode, and a second portion of said transparent electrode electrically connects said second conducting layer of said plurality of first stacked structures and said first conducting layer of said plurality of second stacked structures.

6. The method according to claim 5, wherein said plurality of first stacked structures and said plurality of said second stacked structures are formed using one step of photolithography.

7. The method according to claim 5, wherein said substrate is exposed from said second surface by using said plurality of first stacked structures and said plurality of second stacked structures as masks in said step of forming a patterned photo-imagable layer.

8. The method according to claim 5, wherein said first conducting layer is a gate electrode.

* * * * *